(12) United States Patent
Kawai et al.

(10) Patent No.: US 12,010,791 B2
(45) Date of Patent: Jun. 11, 2024

(54) DEVICE, ELECTRONIC APPARATUS, AND WIRING CONNECTION METHOD

(71) Applicant: SONY GROUP CORPORATION, Tokyo (JP)

(72) Inventors: Hiroshi Kawai, Tokyo (JP); Taizo Nishimura, Tokyo (JP); Masahiko Shimizu, Tokyo (JP); Takayuki Tanaka, Tokyo (JP); Naohiro Takahashi, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 204 days.

(21) Appl. No.: 17/754,625

(22) PCT Filed: Oct. 13, 2020

(86) PCT No.: PCT/JP2020/038638
§ 371 (c)(1),
(2) Date: Apr. 7, 2022

(87) PCT Pub. No.: WO2021/075427
PCT Pub. Date: Apr. 22, 2021

(65) Prior Publication Data
US 2022/0394846 A1 Dec. 8, 2022

(30) Foreign Application Priority Data
Oct. 15, 2019 (JP) .................................. 2019-188695

(51) Int. Cl.
*H05K 1/02* (2006.01)
*H05K 3/20* (2006.01)

(52) U.S. Cl.
CPC ............. *H05K 1/0277* (2013.01); *H05K 3/20* (2013.01)

(58) Field of Classification Search
CPC ............................... H05K 1/0277; H05K 3/20
(Continued)

(56) References Cited

U.S. PATENT DOCUMENTS 9,854,668 B2 * 12/2017 Sano ...................... H05K 1/111
2012/0105356 A1 * 5/2012 Brosnan ................ G06F 3/0445
29/854

(Continued)

FOREIGN PATENT DOCUMENTS

| CN | 107429983 A | 12/2017 |
| CN | 109475049 A | 3/2019 |

(Continued)

OTHER PUBLICATIONS

International Search Report and Written Opinion of PCT Application No. PCT/JP2020/038638, dated Dec. 8, 2020, 09 pages of ISRWO.

*Primary Examiner* — Binh B Tran
(74) *Attorney, Agent, or Firm* — CHIP LAW GROUP

(57) ABSTRACT

A device includes an elastic base, a device body provided on the base, a wiring line provided on the base, a coupling member coupled to the wiring line, and an electrically conductive adhesive layer provided between the wiring line and the coupling member. The wiring line extends from the electrically conductive adhesive layer to the device body. The wiring line has a wiring portion overlapping with the electrically conductive adhesive layer. The degree of polymerization of the electrically conductive adhesive layer decreases in the extending direction of the wiring portion.

12 Claims, 8 Drawing Sheets

(58) Field of Classification Search
USPC .......................................................... 361/749
See application file for complete search history.

(56) References Cited

U.S. PATENT DOCUMENTS

2014/0361183 A1* 12/2014 Takeda ................... H01L 24/83
438/666
2018/0116559 A1   5/2018 Otaka et al.
2018/0154477 A1   6/2018 Jung et al.

FOREIGN PATENT DOCUMENTS

| EP | 3282218 A1 | 2/2018 |
|----|------------|--------|
| JP | 2003-249734 A | 9/2003 |
| JP | 2011-055005 A | 3/2011 |
| JP | 2012-033597 A | 2/2012 |
| JP | 2016-197087 A | 11/2016 |
| JP | 2017-044744 A | 3/2017 |
| JP | 2019-050347 A | 3/2019 |
| KR | 10-2018-0065052 A | 6/2018 |
| TW | 201701830 A | 1/2017 |

* cited by examiner

[ FIG. 1 ]
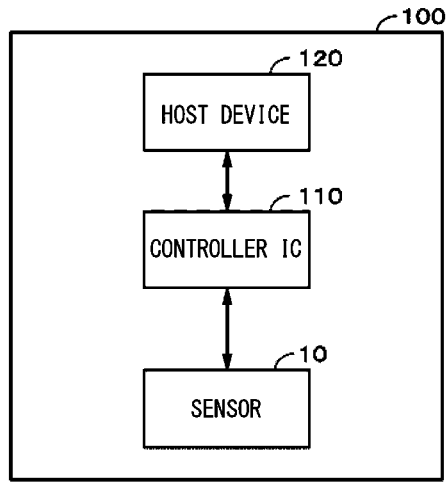
[ FIG. 2 ]
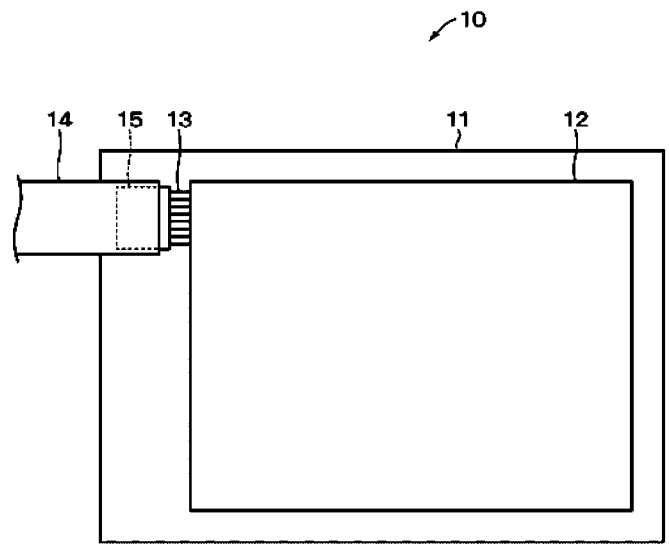

[FIG. 3A]
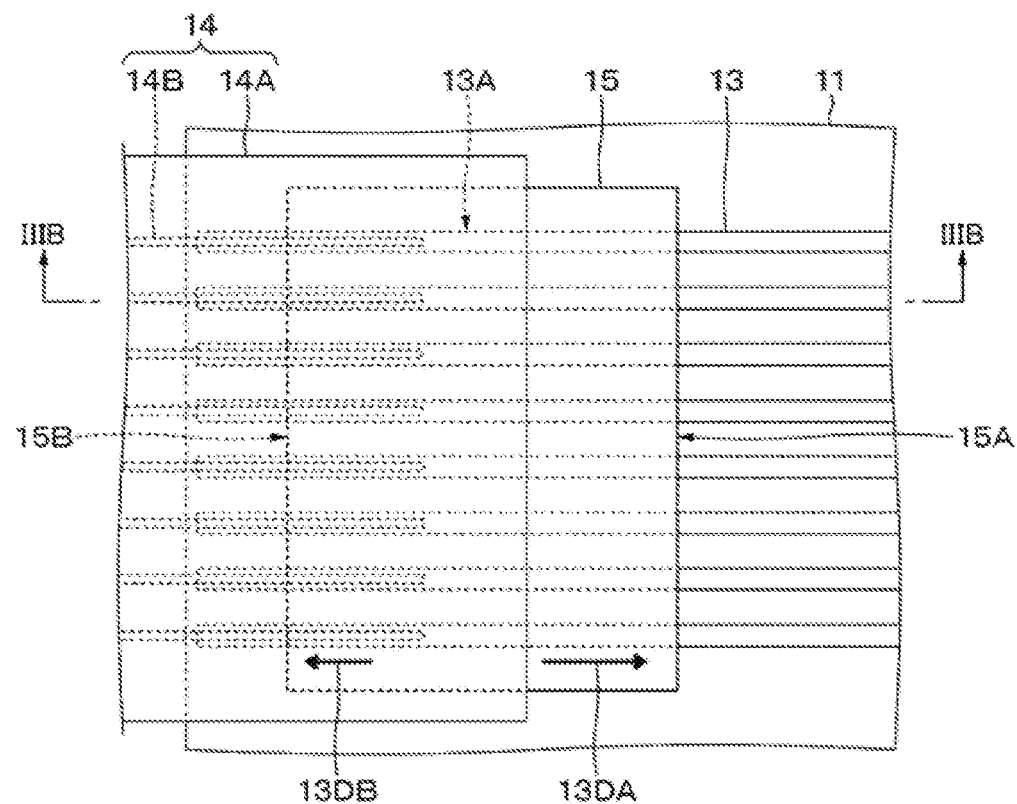
[FIG. 3B]
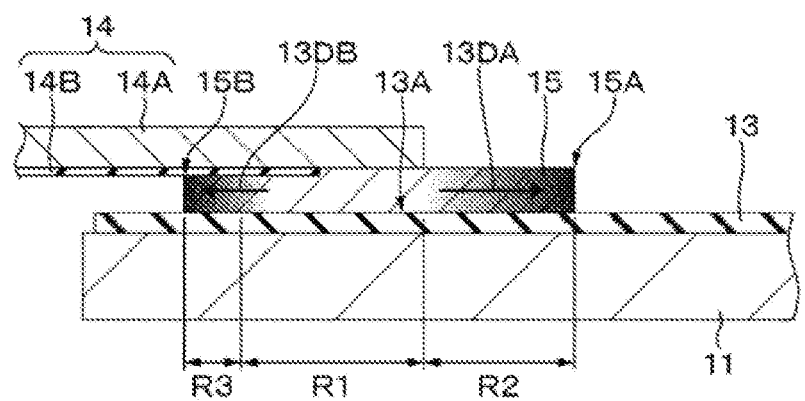

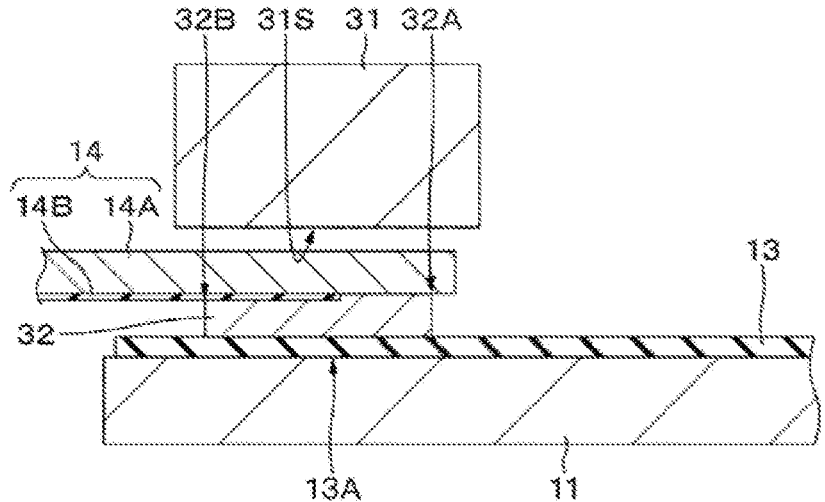
[FIG. 4A]
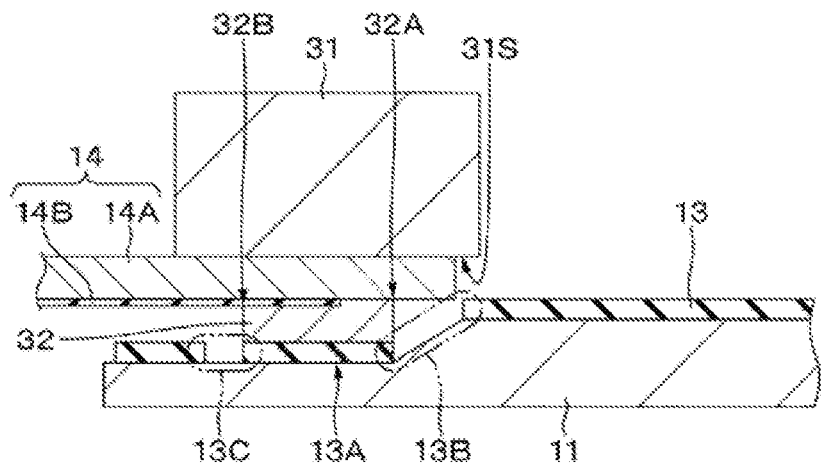
[FIG. 4B]
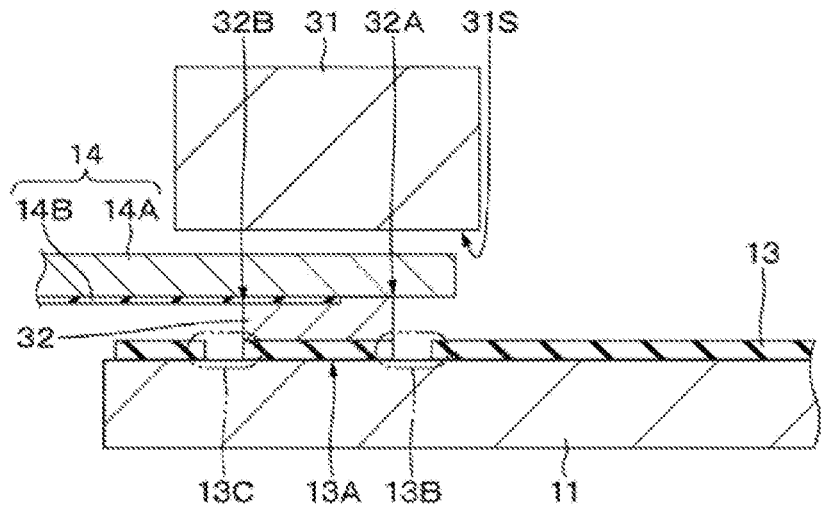
[FIG. 4C]

[FIG. 5A]
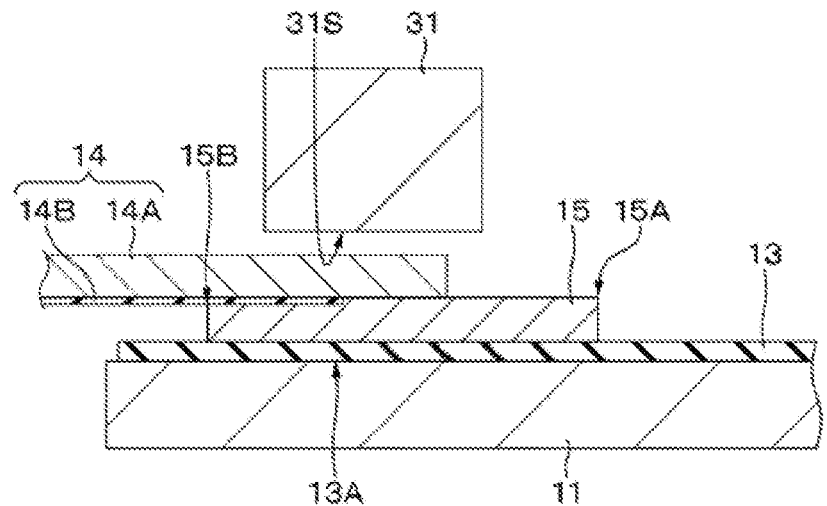
[FIG. 5B]
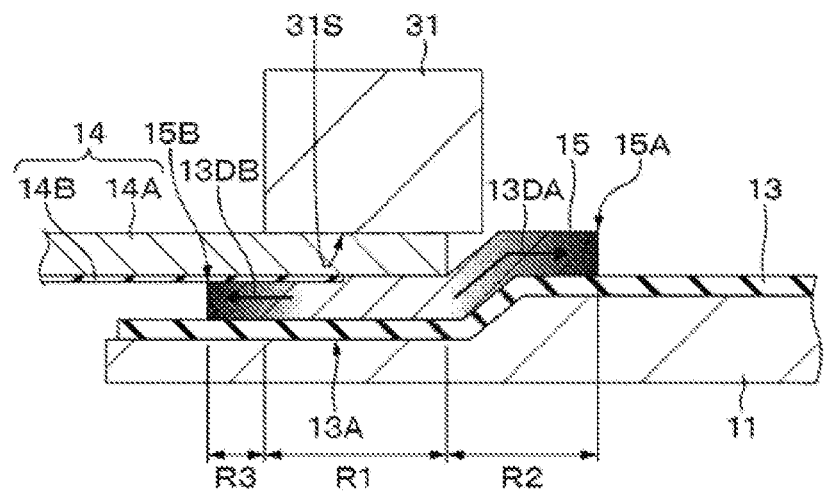
[FIG. 5C]
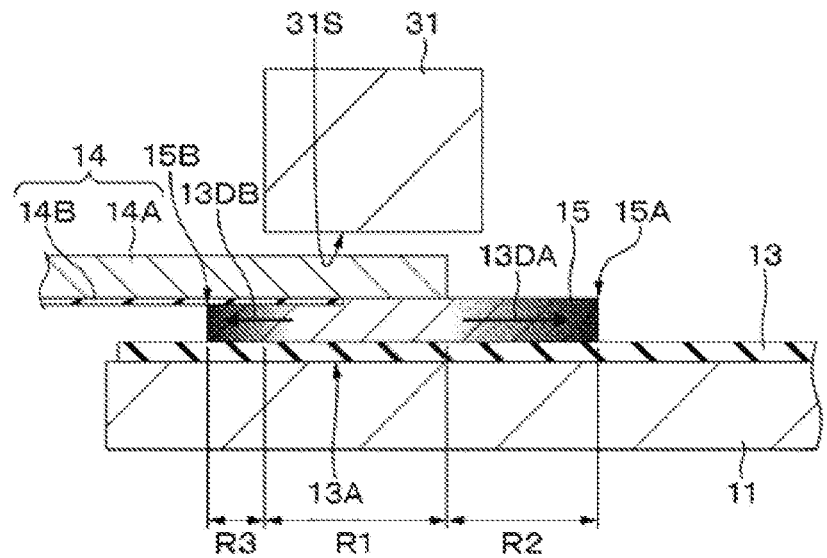

[ FIG. 6 ]
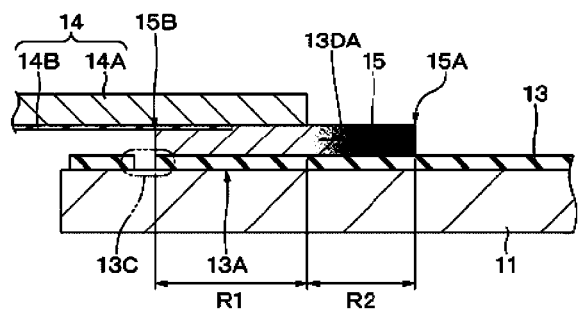
[ FIG. 7 ]
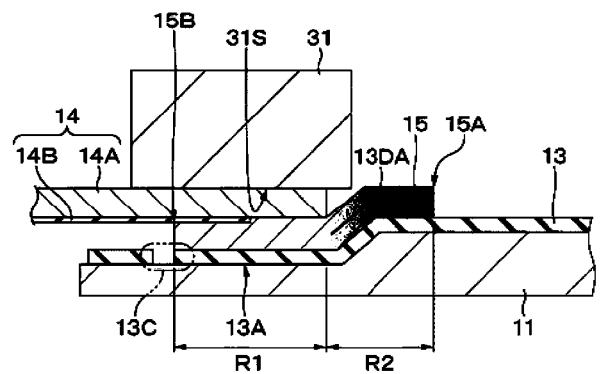

[ FIG. 8 ]
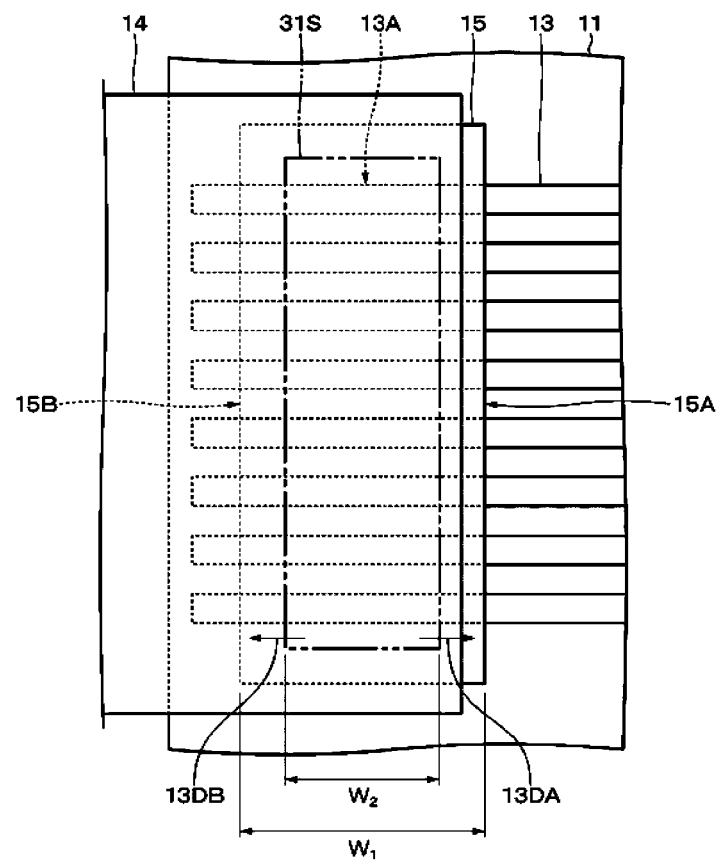

[ FIG. 9 ]
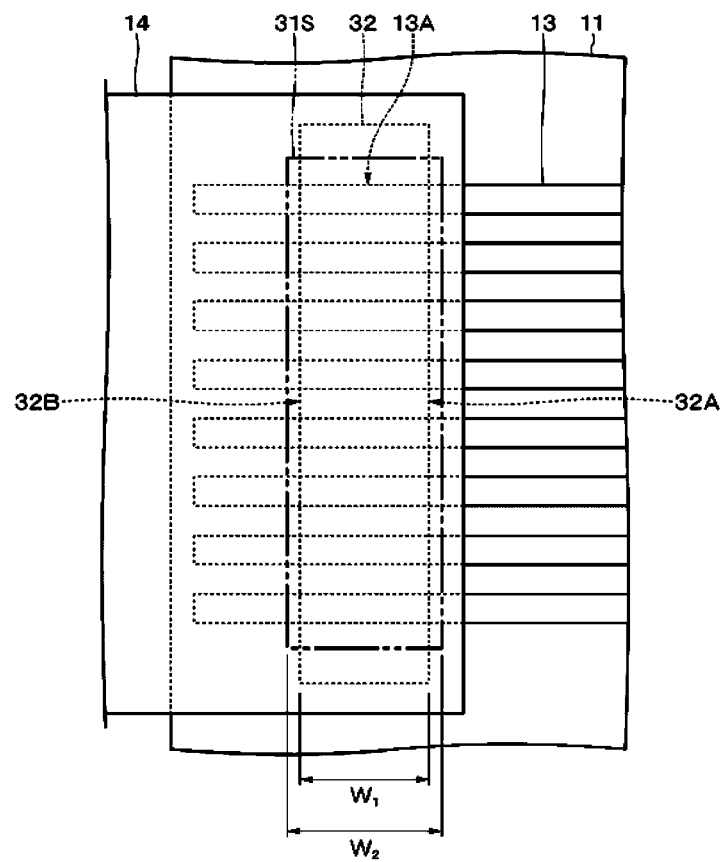

[ FIG. 10 ]
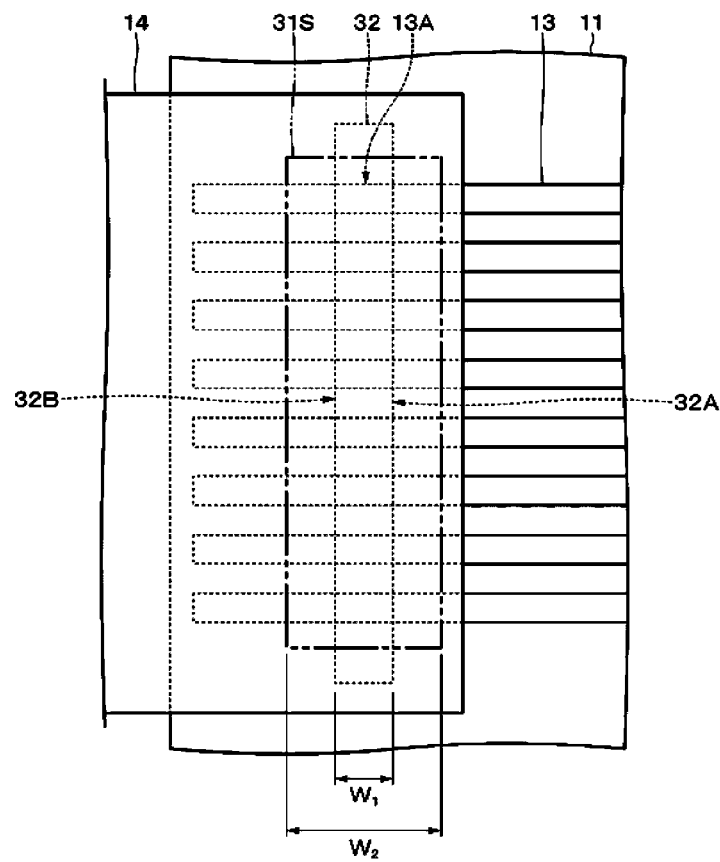

DEVICE, ELECTRONIC APPARATUS, AND WIRING CONNECTION METHOD

CROSS REFERENCE TO RELATED APPLICATIONS

This application is a U.S. National Phase of International Patent Application No. PCT/JP2020/038638 filed on Oct. 13, 2020, which claims priority benefit of Japanese Patent Application No. JP 2019-188695 filed in the Japan Patent Office on Oct. 15, 2019. Each of the above-referenced applications is hereby incorporated herein by reference in its entirety.

TECHNICAL FIELD

The disclosure relates to a device, an electronic apparatus, and a wiring coupling method.

BACKGROUND

When a device is mounted on an electronic apparatus, the device is generally coupled to the body of the electronic apparatus via a flexible printed circuit having a plurality of wiring lines. Patent Literature 1 discloses a technique for anisotropic conductive connection between the wiring lines of a flexible printed circuit and a terminal of a glass or plastic substrate via an anisotropic conductive film.

CITATION LIST

Patent Literature

[PTL 1] Japanese Unexamined Patent Application Publication No. 2011-55005

SUMMARY OF THE INVENTION

Problems to be Solved by the Invention

Unfortunately, in a case where the device includes a base having elasticity, the wiring lines provided on the elastic base can be broken in pressure bonding processing.

An object of the disclosure is to provide a device that makes it possible to suppress breaking of wiring lines provided on an elastic base, an electronic apparatus including the device, and a wiring coupling method.

Means for Solving the Problem

To address the problem described above, a first disclosure provides a device including:
  a base having elasticity;
  a device body provided on the base;
  a wiring line provided on the base;
  a coupling member coupled to the wiring line; and
  an electrically conductive adhesive layer provided between the wiring line and the coupling member, in which
  the wiring line extends from the electrically conductive adhesive layer to the device body,
  the wiring line has a wiring portion overlapping with the electrically conductive adhesive layer, and
  the electrically conductive adhesive layer has a degree of polymerization decreasing in an extending direction of the wiring portion.

A second disclosure provides an electronic apparatus including the device of the first disclosure.

A third disclosure provides a wiring coupling method including:
  overlaying a coupling member on a wiring line provided on an elastic base with an electrically conductive adhesive layer therebetween;
  pressing and heating a portion inward from a peripheral portion of the electrically conductive adhesive layer from which the wiring line is drawn out.

BRIEF DESCRIPTION OF THE DRAWINGS

FIG. 1 is a block diagram illustrating an exemplary configuration of an electronic apparatus according to one embodiment of the disclosure.

FIG. 2 is a plan view illustrating an exemplary configuration of a sensor according to one embodiment of the disclosure.

FIG. 3A is a plan view illustrating a coupling portion between wiring lines provided on a base and a coupling member in an enlarged manner, and FIG. 3B is a cross-sectional view taken along a line IIIB-IIIB of FIG. 3A.

FIGS. 4A, 4B, and 4C are diagrams for illustrating steps of a method for coupling a device according to a comparative example.

FIGS. 5A, 5B, and 5C are diagrams for illustrating steps of a method for coupling the device according to one embodiment of the disclosure.

FIG. 6 is a cross-sectional view illustrating a modification example of the coupling portion.

FIG. 7 is a diagram for illustrating a step of a wiring coupling method according to a modification example.

FIG. 8 is a schematic diagram illustrating the positional relationship between the pressing face of a thermocompression bonding head and an electrically conductive adhesive layer at the time of formation of the coupling portion in Example 1.

FIG. 9 is a schematic diagram illustrating the positional relationship between the pressing face of the thermocompression bonding head and the electrically conductive adhesive layer at the time of formation of the coupling portion in Comparative Example 1.

FIG. 10 is a schematic diagram illustrating the positional relationship between the pressing face of the thermocompression bonding head and the electrically conductive adhesive layer at the time of formation of the coupling portion in Comparative Example 2.

MODES FOR CARRYING OUT THE INVENTION

Some embodiments of the disclosure will be described in the following order with reference to the drawings. Note that the same or similar parts are denoted by the same reference numerals in all the drawings illustrating the following embodiments.

1. Configuration of Electric Apparatus
2. Configuration of Sensor
3. Wiring Coupling Method
4. Effects
5. Modification Examples

1. Configuration of Electronic Apparatus

FIG. 1 is a block diagram illustrating the configuration of the electronic apparatus 100 according to one embodiment of the disclosure. The electronic apparatus 100 includes a sensor 10, a controller IC 110 serving as a control unit, and a host device 120 serving as a body of the electronic apparatus 100. The controller IC 110 and the host device 120 are provided on a non-illustrated main substrate.

The sensor 10 is an example of a stretchable device. The sensor 10 detects a change in capacitance in response to pressure, and outputs an output signal corresponding to the detected change to the controller IC 110. The controller IC 110 controls the sensor 10, detects the pressing force on the sensor 10 on the basis of the output signal supplied from the sensor 10, and output the pressing force to the host device 120.

Examples of the electronic apparatus 100 include a wearable terminal, a medical device, and a robot. Examples of the wearable terminal include a smart watch, a head-mounted display, a wrist band, a ring, glasses, shoes, and clothing.

2. Configuration of Sensor

FIG. 2 is a plan view illustrating an exemplary configuration of the sensor 10 according to one embodiment of the disclosure. The sensor 10 is a stretchable sensor that includes a base 11, a sensor body 12, a plurality of wiring lines 13, a coupling member 14, and an electrically conductive adhesive layer 15.
(Base)

The base 11 supports the sensor body 12. The base 11 is elastic in an in-plane direction of the base 11 and a thickness direction of the base 11. The base 11 includes a polymer resin having elasticity, for example. Examples of the polymer resin include at least one selected from the group consisting of a thermoplastic urethane (TPU) resin, an acrylic resin, an epoxy resin, a silicone resin, and a styrene-butadiene rubber (SBR) resin. The base 11 has a plate or film shape, for example. It should be noted that the film is defined as including a sheet in the disclosure.

The base 11 preferably has an elongation at break of 30% or greater and 800% or less. The elongation at break is defined by the following expression:

Elongation at break [%]=(($Lb-L0$)/$L0$)×100 where L0 denotes the standard distance a specimen before tensile testing, and Lb denotes a standard distance at the time of breaking. The tensile testing is conducted in accordance with JIS K 6251.
(Wiring Line)

The wiring lines 13 couples the sensor body 12 and the coupling member 14. The wiring lines 13 may be elastic or inelastic in the in-plane direction of the base 11; however, the wiring lines 13 are preferably elastic in the in-plane direction of the base 11. The wiring lines 13 having elasticity makes it possible to expand and contract with expansion and contraction of the base 11. This suppresses abrasion, breaking, or the like of the wiring lines 13.

The wiring lines 13 are provided on one principal face of the base 11. The wiring line 13 extend from the electrically conductive adhesive layer 15 to the sensor body 12. Herein, an extending direction 13DA of the wiring lines 13 refers to the direction in which the wiring lines 13 extend from the electrically conductive adhesive layer 15 to the sensor body 12. The wiring line 13 each have a first end portion electrically coupled to the sensor body 12, and a second end portion electrically coupled to the coupling member 14 via the electrically conductive adhesive layer 15. The second end portions of the wiring lines 13 overlap with the electrically conductive adhesive layer 15 at a wiring portion 13A.

The tips of the second end portions of the wiring lines 13 protrude from the periphery of the electrically conductive adhesive layer 15.

For example, the wiring lines 13 are electrically conductive layers including electrically conductive particles (i.e., electrically conductive particle containing layers), metal plated layers, or metal foil. The electrically conductive layer may include a binder, if needed. The electrically conductive particles include at least one of metal particles or carbon particles.
(Coupling Member)

FIG. 3A is a plan view illustrating a coupling portion between the wiring lines 13 provided on the base 11 and the coupling member 14 in an enlarged manner. FIG. 3B is a cross-sectional view taken along a line IIIB-IIIB in FIG. 3A. The coupling member 14 electrically couples the wiring lines 13 to the main substrate. The coupling member 14 has an elongated shape. The coupling member 14 has a first end portion electrically coupled to the main substrate, and a second end portion electrically coupled to the wiring lines 13 via the electrically conductive adhesive layer 15. The coupling member 14 is a flexible printed circuit (FPC), for example.

The coupling member 14 includes a base 14A and a plurality of wiring lines 14B coupled to one principal face of the base 14A. The wiring lines 14B each have a first end portion electrically coupled to the main substrate, and a second end portion electrically coupled to the corresponding second end portion of the wiring line 13 via the electrically conductive adhesive layer 15. The wiring lines 14B extend in a longitudinal direction of the base 14A and are arranged in a stripe form.
(Electrically Conductive Adhesive Layer)

The electrically conductive adhesive layer 15 electrically couples the second end portions of the wiring lines 13 to the second end portion of the coupling member 14. More specifically, the electrically conductive adhesive layer 15 electrically couples the second end portions of the wiring lines 13 to the second end portions of the wiring lines 14B. The electrically conductive adhesive layer 15 is provided between the second end portions of the wiring lines 13 and the second end portion of the coupling member 14. More specifically, the electrically conductive adhesive layer 15 is provided between the second end portions of the wiring lines 13 and the second end portions of the wiring lines 14B. The electrically conductive adhesive layer 15 has a first peripheral portion 15A from which the wiring lines 13 are drawn out, and a second peripheral portion 15B from which the tips of the second end portions of the wiring lines 13 protrude. The first peripheral portion 15A and the second peripheral portion 15B are opposite to each other. Herein, the term "peripheral portion" refers to a part of the periphery (outer circumference) of the electrically conductive adhesive layer 15.

The electrically conductive adhesive layer 15 is configured to electrically couple the second end portions of the wiring lines 13 to the second end portion of the coupling member 14 with thermocompression bonding. The electrically conductive adhesive layer 15 includes electrically conductive particles and an insulating adhesive (binder). The electrically conductive adhesive layer 15 is, for example, an anisotropic conductive film (ACF) or an anisotropic conductive paste (ACP). The insulating adhesive includes a thermoplastic adhesive or a thermosetting adhesive, for example. The insulating adhesive includes at least one of an acrylic resin or an epoxy resin, for example. The insulating adhesive preferably has elasticity.

The electrically conductive adhesive layer 15 has, for example, a polygonal shape (e.g., a rectangular shape), a circular shape, or an oval shape. However, the shape of the electrically conductive adhesive layer 15 is not limited to these particular shapes. FIG. 3A illustrates an example of the electrically conductive adhesive layer 15 having a rectangular shape. In a case where the electrically conductive adhesive layer 15 has a rectangular shape, the first peripheral portion 15A and the second peripheral portion 15B respectively correspond to a first long side portion and a second long side portion.

In a portion inward from the first peripheral portion 15A, the degree of polymerization of the electrically conductive adhesive layer 15 decreases along the extending direction 13DA of the wiring portions 13A. Since the degree of polymerization of the electrically conductive adhesive layer 15 decreases at the portion inward from the first peripheral portion 15A in this way, breaking of the wiring lines 13 in a portion near the first peripheral portion 15A of the electrically conductive adhesive layer 32 is suppressed at the time of coupling between the wiring lines 13 and the coupling member 14.

In a portion inward from the second peripheral portion 15B, the degree of polymerization of the electrically conductive adhesive layer 15 decreases in a direction 13DB opposite to the extending direction 13DA of the wiring portion 13A. Since the degree of polymerization of the electrically conductive adhesive layer 15 decreases at the portion inward from the second peripheral portion 15B in this way, breaking of the wiring lines 13 in a portion near the second peripheral portion 15B of the electrically conductive adhesive layer 32 is suppressed at the time of coupling between the wiring lines 13 and the coupling member 14.

It is to be noted that, in FIG. 3B, gradationally shaded portions of the electrically conductive adhesive layer 15 correspond to the portions in which the degree of polymerization changes. The gradation represents the degree of polymerization: The degree of polymerization decreases from a white portion to a dark portion.

In specific, the degree of polymerization of the electrically conductive adhesive layer 15 described above means the degree of polymerization of the adhesive (binder) in the electrically conductive adhesive layer 15. The decrease in the degree of polymerization of the electrically conductive adhesive layer 15 may be determined by, for example, spectrometry (e.g., Fourier transform infrared spectrometer) or Raman spectroscopy), thermoanalysis (e.g., differential scanning calorimetry (DSC) or thermogravimeter-differential thermal analyzer (TG-DTA)), chromatography (e.g., gel permeation chromatography (GPC) or gas chromatography-mass spectrometry (GCMS), or another analysis method. Additionally, the decrease in the degree of polymerization of the electrically conductive adhesive layer 15 may be determined by hardness measurement (e.g., microhardness or pencil hardness), optical measurement (e.g., refractometry or color difference measurement), or length measurement (measurement of length), or another measurement.

With spectrometry, the decrease in the degree of polymerization of the electrically conductive adhesive layer 15 may be determined on the basis of the difference in absorbing spectra, radiation spectra, or the like, for example. With thermoanalysis, the decrease in the degree of polymerization of the electrically conductive adhesive layer 15 may be determined on the basis of the difference in heat of reaction, thermogravimetric change, or the like, for example. With chromatography, the decrease in the degree of polymerization of the electrically conductive adhesive layer 15 may be determined on the basis of the difference in component dissolved in a solvent, for example. With hardness measurement, the decrease in the degree of polymerization of the electrically conductive adhesive layer 15 may be determined on the basis of the difference in hardness. With optical measurement, the decrease in the degree of polymerization of the electrically conductive adhesive layer 15 may be determined on the basis of the difference in optical property, for example. With length measurement, the decrease in the degree of polymerization of the electrically conductive adhesive layer 15 may be determined on the basis of the difference in change of volume, for example.

The electrically conductive adhesive layer 15 includes a first region R1, a second region R2, and a third region R3. In the first region R1, the electrically conductive particles are crushed. In the second region R2 and the third region R3, the electrically conductive particles are not crushed. The second region R2 is provided adjacent to the first peripheral portion 15A. The third region R3 is provided adjacent to the second peripheral portion 15B. The first region R1 is provided between the second region R2 and the third region R3. That is, the first region R1, the second region R2, and the third region R3 are provided in the order of the third region R3, the first region R1, and the second region R2 in the extending direction 13DA of the wiring lines 13. Whether or not the electrically conductive particles in the electrically conductive adhesive layer 15 are crushed may be determined by observing the shapes of the electrically conductive particles with a microscope, for example.

3. Wiring Coupling Method

Hereinafter, an existing wiring coupling method and a wiring coupling method according to one embodiment of the disclosure will be both described to facilitate the understanding of the difference between these methods.

The existing wiring coupling method is described with reference to FIGS. 4A, 4B, and 4C as follows. First, as illustrated in FIG. 4A, the second end portion of the coupling member 14 is overlaid on the second end portions of the wiring lines 13 provided on the base 11 with an electrically conductive adhesive layer 32 therebetween. Next, as illustrated FIG. 4B, the second end portion of the coupling member 14 is pressed and heated by a thermocompression bonding head 31 in such a condition that a pressing face 31S of the thermocompression bonding head 31 extends over both a first peripheral portion 32A and a second peripheral portion 32B of the electrically conductive adhesive layer 32.

The base 11 is thereby partially pressed, exerting a shear stress on the wiring lines 13 in the in-plane direction of the base 11. Additionally, the electrically conductive adhesive layer 32 thermally contracts in the in-plane direction of the base 11, exerting a contractile force caused by the thermal contraction on the wiring lines 13. Due to the shear stress and the contractile force exerted on the wiring lines 13, the wiring lines 13 are broken at a portion near the first peripheral portion 32A of the electrically conductive adhesive layer 32 (see a region 13B surrounded by a dashed-two dotted line in FIG. 4B). Additionally, due to the contractile force described above, the wiring lines 13 are broken at a portion near the second peripheral portion 32B of the electrically conductive adhesive layer 32 (see region 13C surrounded by a dashed-two dotted line in FIG. 4B). It is to be noted that a surface of the base 11 is cracked at some locations corresponding to the above-described portions where the wiring lines 13 are broken, depending on the degree of thermal contraction described above. Then, as illustrated in FIG. 4C, the pressing and heating with the thermocompression bonding head 31 are stopped. The pressed portions of the base 11 thereby return to the original thickness.

An example of the wiring coupling method according to one embodiment of the disclosure is described with reference to FIGS. 5A, 5B, and FIG. 5C as follows. It is to be noted that, in FIGS. 5B and 5C, gradationally shaded portions of the electrically conductive adhesive layer 15 correspond to the portions in which the degree of polymerization changes. The gradation represents the degree of polymerization: The degree of polymerization decreases from a white portion to a dark portion.

First, as illustrated in FIG. 5A, the second end of the coupling member 14 is overlaid on the second end portions of the wiring lines 13 provided on the base 11 with via the electrically conductive adhesive layer 15 therebetween. Next, as illustrated in FIG. 5B, the second end portion of the coupling member 14 is pressed and heated by the thermocompression bonding head 31 in such a condition that the pressing face 31S of the thermocompression bonding head 31 is located inward from the first peripheral portion 15A and the second peripheral portion 15B of the electrically conductive adhesive layer 15.

This causes the degree of polymerization of the electrically conductive adhesive layer 15 to decrease in the extending direction 13DA of the wiring portion 13A within the portion inward from the first peripheral portion 15A, and the degree of polymerization of the electrically conductive adhesive layer 15 to decrease in the extending direction 13DB opposite to the extending direction 13DA of the wiring portion 13A within the portion inward from the second peripheral portion 15B. Accordingly, it is possible to distribute the shear stress exerted in the in-plane direction of the base 11. It is also possible to reduce the thermal contraction of the electrically conductive adhesive layer 15 and suppress generation of a thermal contraction force. Accordingly, it is possible to suppress the breaking of the wiring lines 13 at the portions near the first peripheral portion 32A and the second peripheral portion 32B of the electrically conductive adhesive layer 3. Additionally, it is possible to suppress generation of cracks at the locations on the surface of the base 11 near the first peripheral portion 32A and the second peripheral portion 32B of the electrically conductive adhesive layer 32.

By the pressing and heating using the thermocompression bonding head 31, the first region R1, the second region R2, and the third region R3 are formed in the order of the third region R3, the first region R1, and the second region R2 in the extending direction 13DA of the wiring lines 13.

The distance from the first peripheral portion 15A of the electrically conductive adhesive layer 15 to the periphery of the pressing face 31S of the thermocompression bonding head 31 is preferably 0.5 mm or greater, more preferably 1 mm or greater, still more preferably 1.5 mm or greater to improve the effect of suppressing the breaking of the wiring lines 13. The distance from the second peripheral portion 15B of the electrically conductive adhesive layer 15 to the periphery of the pressing face 31S of the thermocompression bonding head 31 is preferably 0.5 mm or greater, more preferably 1 mm or greater, still more preferably 1.5 mm or greater to improve the effect of suppressing the breaking of the wiring lines 13. The thermocompression bonding pressure is 0.1 MPa or greater and 10 MPa or less, for example. The thermocompression bonding temperature is 130° C. or greater and 200° C. or less, for example.

Then, as illustrated in FIG. 5C, the pressing and heating with the thermocompression bonding head 31 are stopped. The pressed portions of the base 11 thereby return to the original thickness.

4. Effects

In the sensor (device) 10 according to the embodiment of the disclosure described above, the wiring lines 13 have the wiring portion 13A overlapping with the electrically conductive adhesive layer 15. At the portion inward from the first peripheral portion 15A, the degree of polymerization of the electrically conductive adhesive layer 15 decreases in the extending direction 13DA of the wiring portion 13A. Additionally, at the portion inward from the second peripheral portion 15B, the degree of polymerization of the electrically conductive adhesive layer 15 decreases in the direction 13DB opposite to the extending direction 13DA of the wiring portion 13A. Accordingly, the breaking of the wiring lines 13 at the portions near the first peripheral portion 15A and the second peripheral portion 15B of the electrically conductive adhesive layer 15 is suppressed at the time of coupling between the wiring lines 13 and the coupling member 14. Further, the breaking of the wiring lines 13 at the portions near the first peripheral portion 15A and the second peripheral portion 15B of the electrically conductive adhesive layer 15 is suppressed even when a shock is applied to the coupling portion between the wiring lines 13 and the coupling member 14 after the coupling of the wiring lines 13 and the coupling member 14.

According to the wiring coupling method according to the embodiment of the disclosure, the coupling member 14 is overlaid on the wiring lines 13 provided on the base 11 having elasticity with the electrically conductive adhesive layer 15 therebetween, and the electrically conductive adhesive layer 15 is pressed and heated at the portion inward from the first peripheral portion 15A and the portion inward from the second peripheral portion 15B. This suppresses the breaking of the wiring lines 13 at the portions near the first peripheral portion 32A and the second peripheral portion 32B of the electrically conductive adhesive layer 32 at the time of coupling between the wiring lines 13 and the coupling member 14.

5. Modification Examples

Modification Example 1

In the embodiment described above, the wiring lines 13 are not broken at a portion near the second peripheral portion 15B of the electrically conductive adhesive layer 15. However, as illustrated in FIG. 6, the wiring lines 13 may be broken at the portion near the second peripheral portion 15B of the electrically conductive adhesive layer 15 (see a region 13C surrounded by dashed-two dotted line in FIG. 6). In this case, the electrically conductive adhesive layer 15 includes the first region R1 in which the electrically conductive particles are crushed, and the second region R2 in which the electrically conductive particles are not crushed. The second region R2 is provided adjacent to the first peripheral portion 15A, and the first region R1 is provided adjacent to the second peripheral portion 15B. That is, the first region R1 and the second region R2 are provided in the order of the first region R1 and the second region R2 in the extending direction 13DA of the wiring lines 13.

An example of the wiring coupling method involving the breaking of the wiring lines 13 is described as follows. First, as in the wiring coupling method according to the example embodiment described above, the second end portion of the coupling member 14 is overlaid on the second end portions of the wiring lines 13 provided on the base 11 with the electrically conductive adhesive layer 15 therebetween. Next, as illustrated in FIG. 7, the thermocompression bonding head 31 presses and heats the second end portion of the coupling member 14 in such a condition that the pressing face 31S is located inward from the first peripheral portion 15A of the electrically conductive adhesive layer 15 and extends over the second peripheral portion 15B of the electrically conductive adhesive layer 15. Accordingly, the breaking of the wiring lines 13 is suppressed at the portion near the first peripheral portion 15A of the electrically conductive adhesive layer 15, whereas the wiring lines 13 are broken at the portion near the second peripheral portion 15B of the electrically conductive adhesive layer 15. Additionally, the first region R1 and the second region R2 are formed in the order of the first region R1 and the second region R2 in the extending direction 13DA of the wiring lines 13. Then, as in the wiring coupling method according to the embodiment described above, the pressing and heating with the thermocompression bonding head 31 are stopped.

Modification Example 2

Although the device is the sensor body 12 in the embodiment described above, the device should not be limited to the sensor body 12. The device may be, for example, an electronic circuit board, a display, a solar cell, a thin film transistor (TFT) substrate, a memory, a battery, or the like. In this case, the device body may be, for example, an electronic circuit, a display body, a solar cell body, a TFT, a memory body, a battery body, or the like. The device formation method includes, for example, etching, laser drawing, screen printing, gravure printing, flexographic printing, inkjet, direct drawing, pasting, or the like. These methods may be used alone or in combination of two or more of them. The device body may have elasticity.

Modification Example 3

In the embodiment described above, the tips of the second end portions of the wiring lines 13 protrude from the periphery of the electrically conductive adhesive layer 15. However, the tips of the second end portions of the wiring lines 13 may not protrude from the periphery of the electrically conductive adhesive layer 15.

Examples

In the following, the disclosure is described in specific with reference to some examples. However, the disclosure should not be limited to these examples. It is to be noted that components in Example 1 and Comparative Examples 1 to 5 corresponding to the components in the embodiment or the comparative example described above are denoted with the same reference numerals.

Example 1

First, the base 11 made of thermoplastic urethane and having elasticity was prepared. An Ag paste was applied on the base 11 to form the wiring lines 13 arranged into a stripe form. Next, one end portion of the coupling member (FPC) 14 was overlaid on one end portions of the wiring lines 13 provided on the base 11 with the electrically conductive adhesive layer (ACF) 15 therebetween. When the electrically conductive adhesive layer 15 and the wiring lines 13 were seen in plan view in a direction orthogonal to one principal face of the base 11 at this time, the coupling member 14 and the electrically conductive adhesive layer 15 were arranged on the base 11 such that the long sides of the electrically conductive adhesive layer 15 were orthogonal to the extending direction 13DA of the wiring lines 13. Additionally, the width $W_1$ of the electrically conductive adhesive layer 15 was set to 6 mm.

Next, one end of the coupling member 14 was pressed and heated using the thermocompression bonding head 31 in such a condition that the pressing face 31S of the thermocompression bonding head 31 was located inward from the first peripheral portion 15A and the second peripheral portion 15B of the electrically conductive adhesive layer 15. One end portion of the coupling member was thereby pressed and heated by the thermocompression bonding head 31. FIG. 8 is a schematic diagram illustrating the positional relationship between the pressing face 31S of the thermocompression bonding head 31 and the electrically conductive adhesive layer 15 at the time of formation of the coupling portion in Example 1. The conditions for pressure bonding with the thermocompression bonding head 31 were as follows.

Width $W_2$ of Thermocompression bonding head 31: 3 mm
Setting Pressure for Pressing Face 31S: 0.1 MPa
Setting temperature: 165° C.
Pressure bonding time: 60 seconds The pressing and heating with the thermocompression bonding head 31 were then stopped. As described above, the one end portions of the wiring lines 13 provided on the base 11 were coupled to the one end portion of the coupling member 14 by thermal compression bonding, forming the coupling portion.

Comparative Example 1

FIG. 9 is a schematic diagram illustrating the positional relationship between the pressing face 31S of the thermocompression bonding head 31 and the electrically conductive adhesive layer 32 at the time of formation of the coupling portion in Comparative Example 1. The width $W_1$ of the electrically conductive adhesive layer 32 was set to 2 mm. Additionally, one end portion of the coupling member 14 was pressed and heated using the thermocompression bonding head 31 in such a condition that the pressing face 31S of the thermocompression bonding head 31 was located outward from the first peripheral portion 32A and the second peripheral portion 32B of the electrically conductive adhesive layer 32. Except the point described above, the coupling portion was formed through the same processes as those in Example 1.

Comparative Example 2

FIG. 10 is a schematic diagram illustrating the positional relationship between the pressing face 31S of the thermocompression bonding head 31 and the electrically conductive adhesive layer 32 at the time of formation of the coupling portion in Comparative Example 2. The width $W_1$ of the electrically conductive adhesive layer 32 was set to 1 mm. Except the point described above, the coupling portion was formed through the same processes as those in Comparative Example 1.

Comparative Examples 3 to 5

In place of the base 11 made of thermoplastic urethane and having elasticity, the base 11 made of polyethylene terephthalate (PET) and having no elasticity was used. Except this point, the coupling portion was formed through the same processes as those in Example 1 and Comparative Examples 1 and 2.
(Evaluation)

It was determined whether or not the wiring lines 13 had been broken at the portions near the first peripheral portions 15A and 32A and the second peripheral portions 15B and 32B of the electrically conductive adhesive layers 15 and 32. The results of the determination are illustrated in Tables 1 and 2.

Table 1 indicates the configurations of the coupling portions and the results of the evaluation of Example 1 and Comparative Examples 1 and 2.

TABLE 1

|  | Example 1 | Comparative Example 1 | Comparative Example 2 |
|---|---|---|---|
| Material for base | Thermoplastic urethane (Elastic base) | Thermoplastic urethane (Elastic base) | Thermoplastic urethane (Elastic base) |
| Material for wiring line | Ag paste (Elastic) | Ag paste (Elastic) | Ag paste (Elastic) |
| Width $W_1$ of ACF [mm] | 6 | 2 | 1 |
| Width $W_2$ of head [mm] | 3 | 3 | 3 |
| Condition for thermal compression bonding | FIG. 8 | FIG. 9 | FIG. 10 |
| Result of Measurement | No breaking found | Breaking Found | Breaking Found |

Table 2 illustrates the configurations of the coupling portions and the results of evaluation of Comparative Examples 1 to 3.

TABLE 2

|  | Comparative Example 3 | Comparative Example 4 | Comparative Example 5 |
|---|---|---|---|
| Material for base | PET (Nonelastic base) | PET (Nonelastic base) | PET (Nonelastic base) |
| Material for wiring line | Ag paste (Elastic) | Ag paste (Elastic) | Ag paste (Elastic) |
| Width $W_1$ of ACF [mm] | 6 | 2 | 1 |
| Width $W_2$ of head [mm] | 3 | 3 | 3 |
| Condition for thermal compression bonding | FIG. 8 | FIG. 9 | FIG. 10 |
| Result of Measurement | No breaking found | No breaking found | No breaking found |

It is apparent from Table 1 that the breaking of the wiring lines 13 was suppressed at the portions near the first peripheral portion 15A and the second peripheral portion 15B of the electrically conductive adhesive layer 15 by pressing and heating one end portion of the coupling member 14 with the thermocompression bonding head 31 in such a condition that the pressing face 31S of the thermocompression bonding head 31 was located inward from the first peripheral portion 15A and the second peripheral portion 15B of the electrically conductive adhesive layer 15.

It is apparent from Table 2 that no breaking of the wiring lines 13 was generated at the portions near the first peripheral portions 15A and 32A and the second peripheral portions 15B and 32B of the electrically conductive adhesive layers 15 and 32 in a case where the base 11 having no elasticity was used, regardless of whether or not the pressing face 31S of the thermocompression bonding head 31 was located inward from the first peripheral portions 15A and 32A and the second peripheral portions 15B and 32B of the electrically conductive adhesive layers 15 and 32.

Some embodiments of the disclosure are described in specific in the above description, the disclosure should not be limited to the embodiments described above. Various modifications may be made on the basis of the technical concept of the disclosure.

For example, the configurations, methods, processes, shapes, materials, numerical values, etc. listed in the above-described embodiments are only examples, and different configurations, methods, processes, shapes, materials, numerical values, etc. may be used, as necessary.

Further, the configurations, methods, processes, shapes, materials, numerical values, etc. of the above-described embodiments may be combined with each other as long as they do not depart from the gist of the disclosure.

In the numerical ranges described in steps in the above-described embodiments, the upper or lower limit of the numerical range of one step may be replaced by the upper or lower limit of the numerical range of another step. Unless otherwise specified, the materials illustrated in the above-described embodiments may be used alone or in combination of two or more of them.

Further, the following configurations may be applied to the disclosure.

(1) A device including:
   a base having elasticity;
   a device body provided on the base;
   a wiring line provided on the base;
   a coupling member coupled to the wiring line; and
   an electrically conductive adhesive layer provided between the wiring line and the coupling member and including electrically conductive particles, in which
   the wiring line extends from the electrically conductive adhesive layer to the device body,
   the wiring line has a wiring portion overlapping with the electrically conductive adhesive layer, and
   the electrically conductive adhesive layer has a degree of polymerization decreasing in an extending direction of the wiring portion.

(2) The device according to (1), in which
   the electrically conductive adhesive layer includes a first region in which the electrically conductive particles are crushed and a second region in which the electrically conductive particles are not crushed, and
   the first region and the second region are provided in an order of the first region and the second region in the extending direction of the wiring portion.

(3) The device according to (1) or (2), in which
   the electrically conductive adhesive layer includes an adhesive, and
   the adhesive has elasticity.

(4) The device according to any one of (1) to (3), in which
   the device body has elasticity.

(5) The device according to any one of (1) to (4), in which
   the electrically conductive adhesive layer is an anisotropic conductive film or a anisotropic conductive adhesive.

(6) The device according to any one of (1) to (5), in which the coupling member is a flexible printed circuit.
(7) The device according to any one of (1) to (6), in which the device body is a sensor body.
(8) An electronic apparatus including the device according to any one of (1) to (7).
(9) A wiring coupling method including:
  overlaying a coupling member on a wiring line provided on an elastic base with an electrically conductive adhesive layer therebetween; and
  pressing and heating a portion inward from a peripheral portion of the electrically conductive adhesive layer from which the wiring line is drawn out.

REFERENCE SIGNS LIST 10 sensor (device)
11 base
12 sensor body (device body)
13 wiring line
13DA extending direction
13DB direction opposite to extending direction
14 coupling member
14A base
14B wiring line
15 electrically conductive adhesive layer
15A first peripheral portion
15B second peripheral portion
10SE sensing portion
100 electronic apparatus
110 controller IC
120 host device
R1 first region
R2 second region
R3 third region

The invention claimed is:
1. A device, comprising:
a base having elasticity;
a device body on the base;
a wiring line on the base;
a coupling member coupled to the wiring line; and
an electrically conductive adhesive layer between the wiring line and the coupling member, wherein
  the wiring line extends from the electrically conductive adhesive layer to the device body,
  the wiring line has a wiring portion that overlaps with the electrically conductive adhesive layer,
  the electrically conductive adhesive layer includes:
    a plurality of electrically conductive particles;
    a first peripheral portion;
    a first region that includes the plurality of electrically conductive particles in a crushed state; and
    a second region closer to the first peripheral portion of the electrically conductive adhesive layer than the first region,
  the second region includes the plurality of electrically conductive particles in an uncrushed state,
  each of the first region and the second region of the electrically conductive adhesive layer is in contact with the wiring portion, and
  the electrically conductive adhesive layer has a degree of polymerization that decreases from the first region to the second region in an extending direction of the wiring portion.

2. The device according to claim 1, wherein
  the first region and the second region are provided in an order of the first region and the second region in the extending direction of the wiring portion.
3. The device according to claim 1, wherein
  the electrically conductive adhesive layer includes an adhesive, and
  the adhesive has elasticity.
4. The device according to claim 1, wherein the device body has elasticity.
5. The device according to claim 1, wherein the electrically conductive adhesive layer comprises one of an anisotropic conductive film or an anisotropic conductive adhesive.
6. The device according to claim 1, wherein the coupling member comprises a flexible printed circuit.
7. The device according to claim 1, wherein the device body comprises a sensor body.
8. An electronic apparatus, comprising
  a device that includes:
    a base having elasticity;
    a device body on the base;
    a wiring line on the base;
    a coupling member coupled to the wiring line; and
    an electrically conductive adhesive layer between the wiring line and the coupling member, wherein
      the wiring line extends from the electrically conductive adhesive layer to the device body,
      the wiring line has a wiring portion overlapping with the electrically conductive adhesive layer,
      the electrically conductive adhesive layer includes:
        a plurality of electrically conductive particles;
        a peripheral portion;
        a first region that includes the plurality of electrically conductive particles in a crushed state; and
        a second region closer to the peripheral portion of the electrically conductive adhesive layer than the first region,
      the second region includes the plurality of electrically conductive particles in an uncrushed state,
      each of the first region and the second region of the electrically conductive adhesive layer is in contact with the wiring portion, and
      the electrically conductive adhesive layer has a degree of polymerization that decreases from the first region to the second region in an extending direction of the wiring portion.
9. A wiring coupling method, comprising:
overlaying a coupling member on a wiring line via an electrically conductive adhesive layer, wherein
  the wiring line is on an elastic base,
  the wiring line has a wiring portion that overlaps with the electrically conductive adhesive layer,
  the electrically conductive adhesive layer includes:
    a plurality of electrically conductive particles;
    a peripheral portion;
    a first region that includes the plurality of electrically conductive particles in a crushed state; and
    a second region closer to the peripheral portion than the first region,
  the second region includes the plurality of electrically conductive particles in an uncrushed state,
  each of the first region and the second region of the electrically conductive adhesive layer is in contact with the wiring portion, and the electrically conductive adhesive layer has a degree of polymerization that decreases from the first region to the second region in an extending direction of the wiring portion; and pressing and heating a portion of the first region and the second region inward from the peripheral portion of the electrically conductive adhesive layer.

10. The device according to claim 1, wherein the first region of the electrically conductive adhesive layer has a thickness similar to a thickness of the second region of the electrically conductive adhesive layer.

11. The device according to claim 1, wherein
the electrically conductive adhesive layer further includes:
a second peripheral portion opposite to the first peripheral portion; and
a third region adjacent to the second peripheral portion, and
the first region is between the third region and the second region.

12. The device according to claim 11, wherein the degree of polymerization of the electrically conductive adhesive layer decreases from the first region to the third region opposite to the extending direction of the wiring portion.

* * * * *